United States Patent [19]
Avanzado et al.

[11] 3,954,469
[45] May 4, 1976

[54] METHOD OF CREATING A REPLICATING MATRIX

[75] Inventors: Norma Abigania Avanzado, Redondo Beach; Manfred H. Jarsen, Encino; Csaba K. Hunyar, Los Angeles, all of Calif.

[73] Assignee: MCA Disco-Vision, Inc., Universal City, Calif.

[22] Filed: Oct. 1, 1973

[21] Appl. No.: 402,637

[52] U.S. Cl. .................. 96/35.1; 427/54; 427/240; 427/385
[51] Int. Cl.² ............... G03C 1/68; G03C 5/16
[58] Field of Search ........... 117/34; 96/1, 1.5, 1.6, 96/35.1; 427/54, 240, 385

[56] References Cited
UNITED STATES PATENTS
3,687,664  8/1972  Broadbent .................. 117/34
3,795,534  3/1974  Mehalso et al. ............. 117/34

Primary Examiner—Ralph Husack
Attorney, Agent, or Firm—Marvin H. Kleinberg

[57] ABSTRACT

A video disc master of glass, having a metal surface with microscopic apertures therein representing information, is coated with a commercial photosensitive resist, the sensitivity of which has been enhanced. The resist is uniformly exposed through the glass disc. The unexposed resist is removed using conventional developers to which a surfectant is added. The resulting disc has surface irregularities of predetermined height which can be alternatively used to product "stampers" for embossing replicas or to produce a mold for casting replicas.

3 Claims, 5 Drawing Figures

METHOD OF CREATING A REPLICATING MATRIX

RELATED PATENT APPLICATIONS AND PATENTS

"Articulated Mirror" by James E. Elliott, Ser. No. 333,559, filed Feb. 20, 1973 now U.S. Pat. No. 3,794,410 issued Feb. 26, 1974; "Video Disc Mastering System" by John S. Winslow, Ser. No. 333,560, filed Feb. 20, 1973 now abandoned and continued as Ser. No. 508,815 filed Sept. 29, 1974; "Video Disc Player" by James E. Elliott, Serial No. 314,082, filed Dec. 11, 1972; "Video Disc Player" by James E. Elliott, Ser. No. 299,893, filed Oct. 24, 1972 now U.S. Pat. No. 3,829,622 issued Aug. 13, 1974; "Video Recording and Recording and Reproducing System" by Kent D. Broadbent, Ser. No. 299,892, filed Oct. 24, 1972; "Drop-Out Compensator" by Wayne Ray Dakin, Ser. No. 299,891, filed Oct. 24, 1972; "Video Record Disc and Process for Making Same" by David P. Gregg, Ser. No. 735,007, filed Jan. 27, 1969 now abandoned and continued as Ser. No. 571,259 filed Apr. 24, 1975; "Duplicating Process for Video Disc Records" by Kent D. Broadbent, U.S. Pat. No. 3,658,954, issued Apr. 25, 1972; "Video Signal Transducer Having Servo Controlled Flexible Fiber Optic Track Centering" by David P. Gregg and Keith O. Johnson, U.S. Pat. No. 3,530,258, issued Sept. 22, 1970; "Photoelectric Transducer Head" by David P. Gregg, U.S. Pat. No. 3,349,273, issued Oct. 24, 1967; "Video Disc Playback Assembly" by Keith O. Johnson, U.S. Pat. No. 3,518,442, issued June 30, 1970; "Duplicating Process for Video Disc Records" by Kent D. Broadbent, U.S. Pat. No. 3,687,664, issued Aug. 29, 1972; "Reading Head for Video Disc Player" by Manfred H. Jarsen, Ser. No. 402,635, filed Oct. 1, 1973; "Method of Creating a Replicating Matrix" by Manfred H. Jarsen, Ser. No. 402,636, filed Oct. 1, 1973; "Fluid Cushion Turntable for Video Disc Player", by Manfred H. Jarsen, Ser. No. 402,634, filed Oct. 1, 1973.

BACKGROUND OF THE INVENTION

1. Field of the Invention

The present invention relates generally to the replication of original records and, more particularly, to a method of converting a video disc master which contains information in the form of microscopic "holes" in a metal surface into a master suitable for use in producing replicas.

2. Description of the Prior Art

Over the years, there has been a continuing attempt to achieve a low cost, mass produced disc which contains video information that can be retrieved with an inexpensive home instrument for playback through a conventional television set. Early attempts at providing video information have generally involved the use of video tape recorders of various sorts as well as photographic techniques. Still other approaches have attempted to utilize thermoplastic recording or the surface alteration of a thin metallic film.

In the copending application of John S. Winslow, Ser. No. 333,360, now abandoned and continued as Ser. No. 508,815, filed Sept. 24, 1974, filed Feb. 20, 1973, and assigned to the assignee of the present invention, a method and apparatus was shown for producing a video disc master, which utilized a high power laser in conjunction with a glass disc having a thin film of a relatively low melting point material, such as bismuth, coated thereon. The laser beam was intensity modulated with the video information, and at the point of impingement upon the bismuth film surface, the laser beam, at relatively greater intensities, contained sufficient energy to melt the bismuth film.

The preferred physical properties of a low melting point material, such as bismuth, are that the surface tension of the melted material should cause the molten material to immediately coalesce into small, submicroscopic nodules, thereby leaving an area substantially free of the opaque metal coating. According to the Winslow application, typical "holes" representing video information were on the order of 1 micron.

The single master thus produced cannot, in and of itself, under prior art methods and techniques, be easily utilized to produce hundreds of thousands of replicas rapidly and at low cost. Accordingly, it has been deemed desirable to somehow modify the recorded master so that replication can be easily accomplished.

In the prior art, it has been known to create "masks" with a predetermined pattern which, in turn, could be used in connection with photoetching techniques to create a plurality of duplicate surfaces, each with a similar predetermined pattern in the surface. For example, such a mask could be utilized to selectively expose discs having a very thin metal surface coating to a laser beam, and a plurality of discs having a similar "hole" pattern in the surface could be produced.

Alternatively, a photoengraving process may be employed utilizing a master mask which, through chemical etching techniques, can result in a patterned disc.

Such techniques would not be directly applicable to the needs of the video disc system as presently envisaged because of the costs involved and the time required to create the duplicates or replicas. Since the pattern dimensions closely approximate the wavelength of visible radiation, normal, high speed photographic duplication techniques would be seriously affected by diffraction effects.

SUMMARY OF THE INVENTION

According to the present invention, a glass master disc which generally has a very thin film of opaque material approximately 200–400 A thick, is spin coated with a thin film (approximately 1 micron) of a photoresist, utilizing conventional techniques. The disc is of a glass that is transparent to the near ultraviolet, such as plate glass, which has been lapped and polished. The coating originally deposited upon the disc to create the master is only as thick as is required to provide a uniform, pinhole-free coating that is reasonably opaque to light.

The resist is then "exposed" by slowly rotating the reverse side of the disc in front of a radially movable, reasonably collimated ultraviolet beam. By employing a spiral exposure program, the entire disc is uniformly exposed.

The opaque coating acts as a mask or negative and permits light to expose the photoresist only in the areas where the metallic coating had melted to form holes. As a result of the process, exposed photoresist is found at the hole sites. The remaining, unexposed photoresist is "developed" by washing with known solvents.

After developing, a hole pattern, which was approximately 400 A deep in the opaque metal film, as determined by the thickness of that film, is now, in complementary fashion, reproduced as "bumps" of exposed photoresist, each bump being approximately 1 micron in height, a dimension which is determined by the thickness of the photoresist film.

If the ultimate replica which is to be "read" utilizes reading techniques such as "phase contrast", the thickness of the photoresist will be determined by the desired difference in height between a deformation representing a "hole" and the undeformed surface representing an area of "no-hole". The photoresist layer can be accurately tailored to thicknesses within one quarter of the wavelength of light at any given frequency. Accordingly, the present invention can be employed to produce replicas intended for use with different playback methods using several alternative replicating techniques.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

DESCRIPTION OF THE PREFERRED EMBODIMENTS

Figure 1:
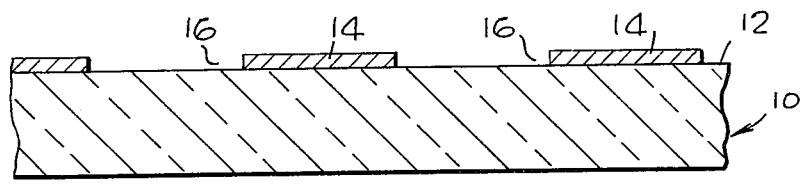
FIG. 1 is a side sectional view of a master disc having information recorded thereon.

Turning first to FIG. 1, there is shown, in side section, a portion of a master disc 10 upon which information has been recorded as taught in the copending application of John S. Winslow, supra. The disc 10, in the present invention, includes a plate glass substrate 12, the upper surface of which has been lapped and polished and to which has been added a thin film 14 of a low melting point material, such as metallic bismuth. As will be appreciated, the glass 12 is selected to be transparent to near ultraviolet radiation. Conventional plate glass has been found to be satisfactory.

During the recording process, a high-power laser beam, which has been focused down to a 1 micron spot, melts the bismuth metal in a predetermined pattern. Surface tension causes the molten metal to coalesce into small, virtually invisible globules, leaving a clear area 16 approximately 1 micron in diameter on the glass surface.

Information is thus recorded as a series of holes 16 in the metallic film 14, arranged in a substantially circular track. In preferred embodiments, the tracks have been spirals with a 2 micron spacing between the centers of adjacent tracks. Normally the opaque film 14 of a low melting point material is deposited at a thickness of approximately 400 A. The film 14 need only be thick enough to assure opacity and freedom from pinholes.

Figure 2:
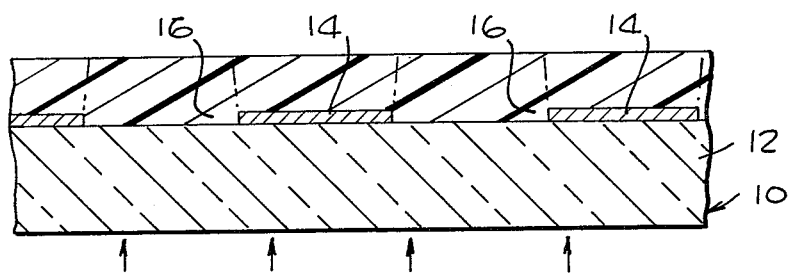
FIG. 2 is a side sectional view of the master of FIG. 1 to which a photoresist coating has been added.

Turning next to FIG. 2, the master disc 10 of FIG. 1 is first washed with xylene and dried. A modified photoresist is prepared from a conventional photoresist such as one identified as CMR 5000 from Dynachem Corporation. Additional sensitizer, identified by Dynachem as N-26, is added. The resulting composition, in one preferred embodiment, comprises 82 cc thinner, 100 cc photoresist, and 0.9 gms of a sensitizer. The amount of additional sensitizer is based upon a percentage of the amount of photoresist employed. When using CMR 5000, the percentage ranges from 1.00 to 1.10. Alternatively, the amount of sensitizer can be expressed as a percentage of the total mixture, in which case the range is from 0.3 to 1.2% and, in the preferred example the quantity is 0.6%. This disc is then uniformly coated with the photoresist compound 18, that is "spun on" to assure a uniform thickness of approximately 1 micron. The thickness of the photoresist coating 18 is determined by many parameters. The "depth" desired in the three dimensional matrix that will result at the completion of the mastering process is only one factor. Depending upon the intended use of the matrix, the thickness may range from 0.7 to 1.5$\mu$.

Other factors to be considered include the diameter of the individual holes 16, the intensity of the exposing beam, and the depth of penetration possible without degradation of resolution of the beam. Since basically a photographic process is being employed, too great a thickness of photoresist 18 might resist exposure or degrade the resolution of the pattern due to diffraction and dispersion effects within the photoresist layer 18.

A photoresist compound selected is conventionally used in the production of microcircuits and is sensitive to near ultraviolet light. Upon exposure, the compound becomes hardened. This resist is chosen to permit operations in the laboratory with visible light. Yellow safelights can provide adequate levels of illumination without prematurely exposing the resist. The unexposed portions of the photoresist are then soluble in a suitable material.

As seen in FIG. 2, the uniform photoresist film 18 covers the metallic layer 14. The metallic film 14 acts as a photonegative or mask for the subsequent exposure of the photoresist 18 in what is essentially a "contact" printing process. Because the resist 18 and the metallic film 14 are in intimate contact, loss of resolution through optical effects is minimized.

The disc with the resist layer applied is sensitive to the environment, and prolonged exposure to the atmosphere degrades the quality of the resultant pattern. Accordingly, the photoresist layer is maintained in a vacuum of approximately ½ mm Hg during the exposure step. Alternatively, the photoresist layer may be kept in an inert atmosphere or a protective coating may be applied to exclude air if the vacuum or inert environment is not convenient.

A collimated ultraviolet source 40 is mounted upon a travelling carriage 42 which is movable in a radial direction. The disc 10 is then slowly rotated, and the source 40 is translated so that a substantially uniform exposure is effected over the entire disc 10. The disc 10 is exposed from the "reverse" side, permitting the metal coating 14 to act as a mask.

In the areas of the holes 16 in the metal coating 14, the radiation exposes the photoresist 18, thereby hardening it. At the conclusion of the exposure step, the hole pattern in the metal film 14 has been recorded in the photoresist 18 as a pattern of relatively hardened areas.

The "developing" process also has required substantial modification. The exposed disc is placed on a spinner which is set for approximately 100 rpm. A liter of xylene is slowly poured on the surface at a rate of about 1 liter per minute.

After pouring the xylene, the central, unexposed area of the disc is wiped clean of xylene. The disc is permitted to spin for additional 15 or so seconds to fully clear the xylene off the disc.

A developer rinse is then applied. The developer rinse consists of a mixture of approximately 350 cc of water plus 600 cc of isopropanol to which 1 to 3 cc of a liquid detergent, such as is marketed by Amway, has been added. This rinse is applied over a period of approximately 25 seconds.

The disc is then rinsed with 2 liters of water. The disc continues to spin until it is substantially dry. The developed disc is then permitted to air dry for approximately 30 minutes. When dry, the disc is baked at a temperature of approximately 260°F. for a period of 20 minutes.

Figure 3:
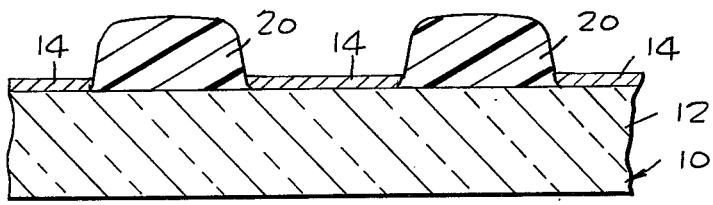
FIG. 3 is a side sectional view of a master after the resist has been exposed and developed.

The developed disc then exhibits a pattern of bumps 20, best seen in FIG. 3. These bumps 20 of exposed and hardened photoresist provide, in three dimensions, the hole pattern that originally existed in the metal costing 14 on the disc 10.

In the preferred embodiment, these bumps 20 are from approximately 0.6 to 0.7 micron in height and ideally should be an elongated shape. As a practical matter, the developing process tends to "round off" the areas of developed resist and a more or less rounded conical shape results. Since the pattern is ultimately "read" by reflecting light from the surface, bump shapes having a relatively low reflectivity of direct light would provide better contrast to the reflectivity of the plane surface between adjacent bumps. Depending upon the intensity of the exposing radiation, the thickness of the resist film 18 and the nature of the developing process, the shape of the bumps 20 can be altered within narrow limits to improve the contrast between a bump 20 and the plane surface.

The developed disc is then subjected to a heating or baking step to "dry out" and to stabilize the developed photoresist. Generally, the manufacturer specifies the time and temperature of such a step. In the preferred embodiment, the disc is baked for 20 minutes at 260°F. However, if the disc is to be used in a casting process, the baking time is increased to 30 minutes.

For the stamping process, the remaining metal 14 on the surface is then dissolved or etched, using a more or less conventional etching solution, such as an aqueous solution of sulfuric acid and hydrogen peroxide ($H_2SO_4/H_2O_2$). The composition of one such solution was 100 cc $H_2SO_4$, 100 cc $H_2O_2$ in 2400 cc of water.

Figure 4:
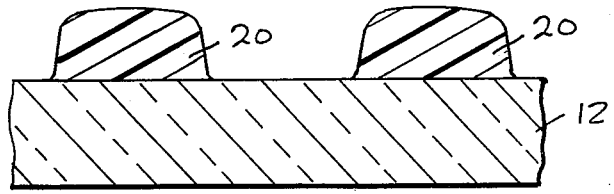
FIG. 4 is a side sectional view of the master after the metal film has been removed.
Figure 5:
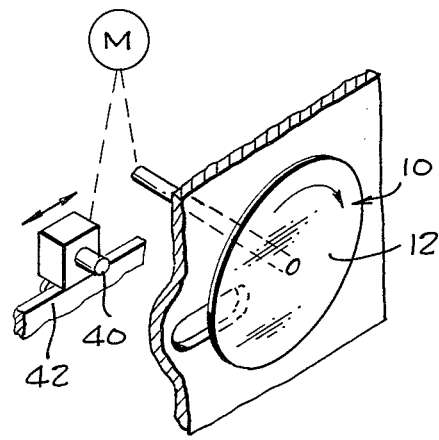
FIG. 5 is an idealized perspective view of apparatus for exposing the photoresist.

The final photoresist master disc, illustrated by FIG. 4, includes the glass substrate 12 and the plurality of bumps 20 of hardened photoresist, arranged in a pattern representing the information that originally existed in the metal coating 14 on the disc 10.

The resulting photoresist matrix disc of FIG. 4 is then the starting point for alternative processes which enable replication of discs by different processes. A first stamping or embossing process utilizes the photoresist matrix in a first series of steps which produce successively a "mother", a "submaster", and a "submother" from which a plurality of "stampers" can be fabricated.

The individual stampers are then placed in a suitable press, and replicas are produced in a fashion similar to the production of phonograph records. Video disc replicas are produced from discs of a thermoplastic material, such as vinyl, rather than from a "biscuit". The vinyl disc is heat and pressure embossed to receive either the bump pattern or a complementary hollow pattern associated with the stamper. It is immaterial to the playback of the information whether the replica is provided with bumps or hollows.

An alternative replication process might be deemed a "casting" process. For this process, the metal coating is not removed after the baking step which is held to approximately 20 minutes. In a second series of steps, the photoresist matrix may be coated with a release agent and then covered with a silicone rubber compound to a depth of from 10 to 15 mils. Following a heat curing step, the cured silicone rubber becomes a mold which is then separated from the photoresist master.

If the photoresist matrix is carefully handled, this mold making process may be repeated for as long as the photoresist matrix remains intact. The mold is used in conjunction with a polymer and a Mylar polyester film substrate to produce replicas.

The polymer is cured in the silicone rubber mold after it has been applied to the Mylar. The polymer layer is about as thick as the surface features which are to be "recorded". The resultant replicated disc consists of a Mylar substrate with a thin layer of cured polymer which exhibits the bump pattern of the photoresist matrix.

If the photoresist matrix should be damaged by the mold making process, the mold itself can be used to make one or more submasters from which yet other silicone rubber molds may be made. A plurality of submolds are then available for the casting of replicas, and the number of molds, submasters and submolds which can be created is limited only by the loss in resolution resulting from each reproduction.

Thus there has been described a process and product which is a necessary first step in the mass production of replicated video discs which can then be utilized on playback equipment to provide a video program through a conventional television receiver. A modified photoresist applied to a master disc and is then exposed through the disc. The exposure pattern is developed and hardened through a novel developing process.

The photoresist formulation is specially tailored for this process by increasing the sensitivity. The developing process is also specially modified to achieve the three dimensional representation of information originally present in only two dimensions.

What is claimed as new is:

1. The process of producing a replicating matrix from a master disc in which information is represented as a multiplicity of transparent and opaque areas over the surface of a transparent disc, comprising the steps of:
    1. fastening the disc to a rotatable spindle with the information bearing surface outermost;
    2. rotating the disc;
    3. washing the rotating disc with xylene;
    4. coating the disc with a premeasured quantity of photoresist to build a desired thickness of photoresist;
    5. drying the photoresist coating for approximately 10 minutes;
    6. removing the disc from the spindle;

7. baking the photoresist coating at a temperature of approximately 260° F. for approximately 15 minutes, whereby the interim product produced can be exposed and developed into a replicating matrix.

2. The process of claim 1, above, further including the steps of:
   a. exposing the photosensitive material to actinic radiation through the transparent disc and through the pattern of apertures;
   b. developing the photosensitive material to selectively remove photosensitive material in a pattern corresponding to the pattern of opaque and radiation transmitting surface areas of the substrate body, whereby a three dimensional replicating matrix is formed representing the record video information.

3. The process of claim 2, above, wherein the developing step comprises the steps of:

rotating the disc;

applying xylene to the photoresist surface of the rotating disc;

mechanically removing xylene near the center of the disc in the non-information representing areas;

washing the rotating disc with a mixture of water, isopropanol and detergent;

rinsing the disc with water;

drying the disc; and baking the disc.

* * * * *

UNITED STATES PATENT OFFICE
CERTIFICATE OF CORRECTION

Patent No. 3,954,469              Dated May 4, 1976

Inventor(s) Norma Abigania Avanzado et al.

It is certified that error appears in the above-identified patent and that said Letters Patent are hereby corrected as shown below:

Column 5, line 9, after "xylene" insert -- and photoresist --.

Column 8, line 8, after "xylene" insert -- and photoresist --.

Signed and Sealed this

Third Day of October 1978

[SEAL]

Attest:

RUTH C. MASON
Attesting Officer

DONALD W. BANNER
Commissioner of Patents and Trademarks